US010620252B2

(12) United States Patent
Generazio

(10) Patent No.: US 10,620,252 B2
(45) Date of Patent: Apr. 14, 2020

(54) ELECTRIC FIELD IMAGING SYSTEM

(71) Applicant: U.S.A. AS REPRESENTED BY THE ADMINISTRATOR OF THE NASA, Washington, DC (US)

(72) Inventor: Edward R. Generazio, Yorktown, VA (US)

(73) Assignee: UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 257 days.

(21) Appl. No.: 15/637,295

(22) Filed: Jun. 29, 2017

(65) Prior Publication Data

US 2018/0203051 A1 Jul. 19, 2018

Related U.S. Application Data

(60) Provisional application No. 62/448,121, filed on Jan. 19, 2017.

(51) Int. Cl.
*G01R 29/12* (2006.01)
*G01R 29/08* (2006.01)
*G01R 13/02* (2006.01)
*G01R 29/14* (2006.01)

(52) U.S. Cl.
CPC ......... *G01R 29/12* (2013.01); *G01R 29/0814* (2013.01); *G01R 29/0878* (2013.01); *G01R 29/0892* (2013.01); *G01R 29/14* (2013.01); *G01R 13/02* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,273,397 | A | * | 9/1966 | Forward ............. G01R 33/022 324/257 |
| 4,931,740 | A | | 6/1990 | Hassanzadeh et al. |
| 5,019,804 | A | | 5/1991 | Fraden |
| 5,164,673 | A | | 11/1992 | Rosener |
| 5,430,381 | A | | 7/1995 | Dower |
| 5,986,456 | A | | 11/1999 | Yamashita |
| 6,025,726 | A | | 2/2000 | Gershenfeld et al. |

(Continued)

FOREIGN PATENT DOCUMENTS

| GB | 2132357 A | 7/1984 |
|---|---|---|
| WO | 2002067015 A1 | 8/2002 |
| WO | 2008152588 A2 | 12/2008 |

OTHER PUBLICATIONS

U.S. Appl. No. 15/177,798 to Generazio. (filed Jun. 9, 2016).

(Continued)

*Primary Examiner* — Jay Patidar
(74) *Attorney, Agent, or Firm* — M. Bruce Harper; Jonathan B. Soike; Helen M. Galus

(57) ABSTRACT

Various embodiments provide technology that may be used in harsh marine and harsh weather environments for the imaging of electric potentials and electric fields to characterize objects or regions. Various embodiments may enable a camera or eye type electric field imaging system that may be used in harsh weather or harsh environments (e.g., harsh marine environments, etc.) to image electrical potentials and electric fields.

17 Claims, 16 Drawing Sheets

(56) References Cited

U.S. PATENT DOCUMENTS

| | | | |
|---|---|---|---|
| 6,031,378 A | 2/2000 | Rosin | |
| 6,645,144 B1 | 11/2003 | Wen et al. | |
| 6,661,115 B2 | 12/2003 | Lester | |
| 6,661,232 B1 | 12/2003 | Horiguchi | |
| 6,762,726 B2 | 7/2004 | Alden | |
| 7,119,553 B2 | 10/2006 | Yang et al. | |
| 7,154,275 B2 | 12/2006 | Zank et al. | |
| 7,242,298 B2 | 7/2007 | Cehelnik | |
| 7,295,019 B2 | 11/2007 | Yang et al. | |
| 7,330,032 B2 | 2/2008 | Donnangelo | |
| 7,471,089 B2 | 12/2008 | Zerilli et al. | |
| 9,279,719 B2 | 3/2016 | Generazio | |
| 2006/0071669 A1 | 4/2006 | Funato et al. | |
| 2006/0164094 A1 | 7/2006 | Golder et al. | |
| 2007/0040545 A1 | 2/2007 | Takiguchi | |
| 2008/0246485 A1 | 10/2008 | Hibbs et al. | |
| 2008/0303530 A1 | 12/2008 | Coursornitros et al. | |
| 2009/0284405 A1 | 11/2009 | Salmon et al. | |
| 2009/0295366 A1 | 12/2009 | Cehelnik | |
| 2009/0295644 A1 | 12/2009 | Curran et al. | |
| 2009/0309604 A1 | 12/2009 | Zhang | |
| 2010/0250140 A1 | 9/2010 | Constable et al. | |
| 2010/0259272 A1 | 10/2010 | Care | |
| 2010/0271291 A1 | 10/2010 | Care | |
| 2011/0062968 A1* | 3/2011 | Renno | G01R 29/12 324/654 |
| 2012/0013354 A1 | 1/2012 | Bowler | |
| 2012/0092019 A1 | 4/2012 | Blum | |
| 2012/0199755 A1 | 8/2012 | Generazio | |
| 2014/0125358 A1 | 5/2014 | Dawson et al. | |
| 2014/0346058 A1 | 11/2014 | Robitzki et al. | |
| 2015/0137825 A1 | 5/2015 | Generazio | |
| 2015/0298174 A1 | 10/2015 | Bibl et al. | |
| 2016/0049885 A1 | 2/2016 | Generazio | |

OTHER PUBLICATIONS

Jackson, John D., "Classical Electrodynamics," Third Edition Book, 1999, Hoboken, New Jersey, United States: John Wiley & Sons.

Generazio, E. R., "Electric Potential and Electric Field Imaging with Applications," Materials Evaluation, Nov. 2015, pp. 1479-148, vol. 73, No. 11.

https://ocw.mit.edu/resources/res-6-002-electromagnetic-field-theory-a-problem-solving-approach-spring-2008/textbook-contents/—Chapter 3, p. 143, Accessed.

Generazio, E. R. et al., "Free-Carrier Absorption in Quantizing Magnetic Fields," Physical Review B, Dec. 15, 1979, pp. 5162-5167, vol. 20, No. 12.

AlphaLab Inc. "The TriboElectric Series" https://www.trifield.com/content/tribo-electric-series/. Visited at least as early as Oct. 2016.

Halliday, D. et al., "Fundamentals of Physics," 2005, pp. 421-423, Hoboken, John Wiley & Sons, Inc., New Jersey.

Horowitz, Paul and Hill, Winfield, "The Art of Electronics", 2nd Ed., Cambridge University Press, pp. 113-173, 1989.

Fairchild Semiconductor Corporation, Junction Field Effect Transistor (JFET), http://www.fairchildsemi.com/ds/mp/mpf102.pdf, 2004.

\* cited by examiner

ELECTRIC FIELD IMAGING SYSTEM

STATEMENT REGARDING FEDERALLY SPONSORED RESEARCH OR DEVELOPMENT

The invention described herein was made by an employee of the United States Government and may be manufactured and used by or for the Government of the United States of America for governmental purposes without the payment of any royalties thereon or therefore.

OVERVIEW

The present disclosure relates to sensors, and more particularly to sensors for measurements of electric potentials and electric fields.

With an electric field sensor, it may be possible to measure the true quantitative electric potential and electrostatic field emanating from, passing through and around objects, or in free space. A quasi-static measurement process for imaging electric potentials and electric fields has been developed using a quasi-static electric field generator. The quasi-static electric field generator allows for the simultaneous calibration and measurement of the electric field sensor responses in the presence of parasitic intrinsic and extrinsic leakage electrical currents that exist in electrical components. These leakage currents manifest themselves as parasitic capacitances, resistances, and inductances throughout solid state elements of electrical components and the supporting structures. The active constitutive electronic materials of the electronic component, as well as mounting structures, all have these manifestations to some degree. Additionally, the leakage currents are not only found in solid structures. Leakage currents may also exist in surrounding gases, liquids, and plasmas. When measuring true static electric potentials and electric fields emanating from an object, the measurement process is made more complex by the leakage of moving charged carriers and polarization toward establishing an equilibrium state of the measurement system due to the presence of the electric field. This equilibrium process is time dependent and prohibits the measurement of the original true electrical potential and electric field in current systems.

Prior quantitative electric field imaging approaches have not successfully met the requirements for operation in harsh or demanding environments, such as harsh marine environments and/or harsh weather environments.

SUMMARY

The present disclosure describes technology for the imaging of electric potentials and electric fields to characterize objects or regions. Various embodiments may enable a camera or eye type electric field imaging system that may be used in harsh weather or harsh environments (e.g., harsh marine environments, etc.) to image electrical potentials and electric fields.

One embodiment of the present disclosure may provide a differencing electrical potential and electric field sensor system including at least a first sensing head and an analysis circuit. The first sensing head may include a first electric potential sensor, a sensor shaft, wherein the first electric potential sensor is disposed on the sensor shaft, and an axle connected to the sensor shaft. The axel is connected such that rotation of the axle rotates the sensor shaft and the first electric potential sensor about the axle. The analysis circuit may be connected to the first sensing head and configured to receive electric potential measurements from the first electric potential sensor and map an electric field based at least in part on the received electric potential measurements from the first electric potential sensor. In various embodiments, the system may include a first container enclosing at least a portion of the first sensing head. In various embodiments, the container may include a multifaceted surface including a collection of electrically conductive elements. In various embodiments, the container may be configured to be hydrophobic.

These and other features, advantages, and objects of the present disclosure will be further understood and appreciated by those skilled in the art by reference to the following specification, claims, and appended drawings.

DETAILED DESCRIPTION

Figure 1A:
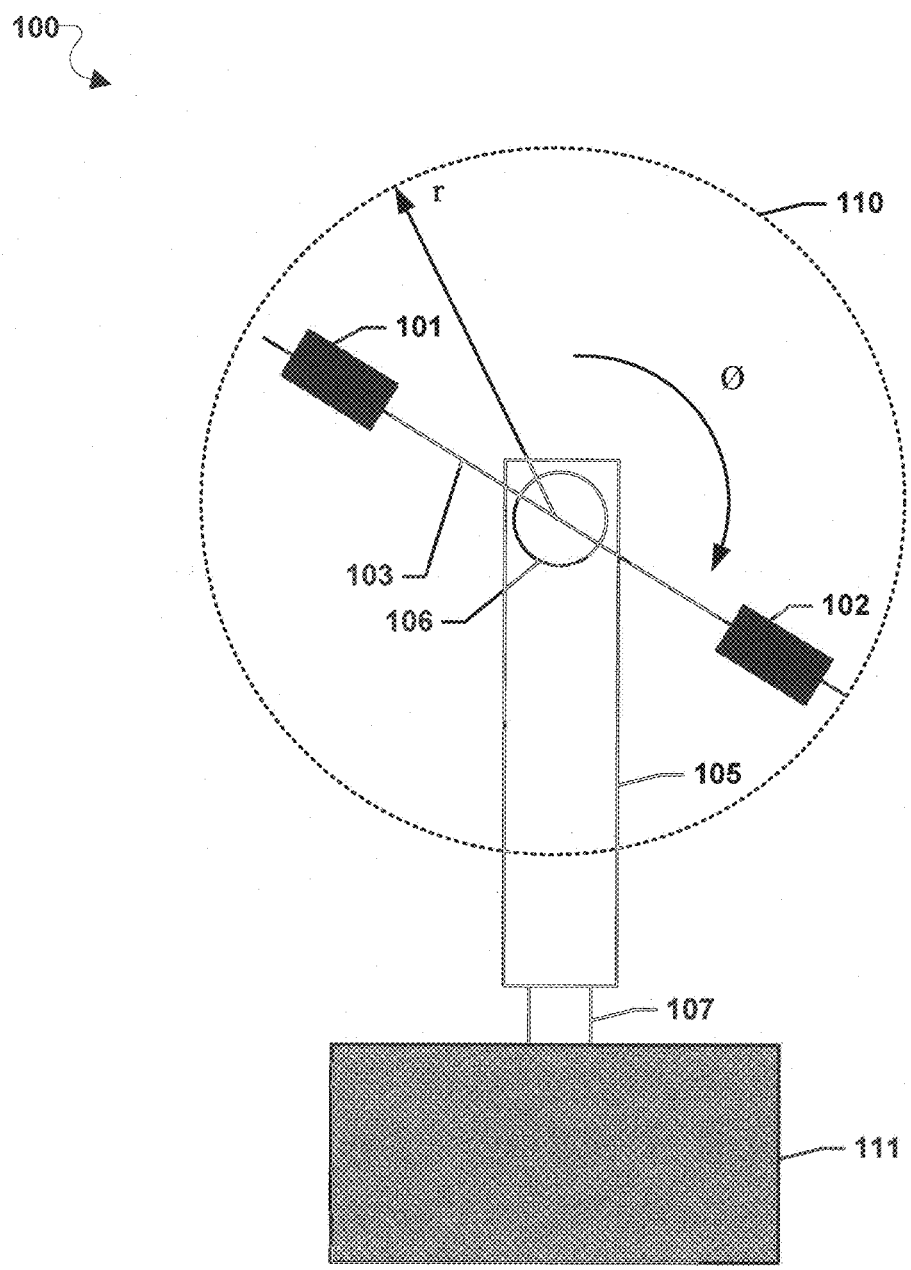
FIGS. 1A and 1B are component block diagrams illustrating front and side views of an electric field imaging device, consistent with one or more embodiments of the present disclosure.

Aspects of the present disclosure address challenges including those discussed above, and are applicable to a variety of applications, devices, systems, and methods for imaging electrical potentials and electric fields. These and other aspects of the present disclosure are exemplified in a number of implementations and applications, some of which are shown in the figures and characterized in the claims section that follows. It should be noted that the figures may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated.

Quantitative electric field imaging has required scanning by electric potential sensors to characterize the true electric fields emanating from objects. For example, U.S. Pat. No. 9,279,719, which is incorporated herein by reference in its entirety for all purposes, describes a methodology for imaging electric potentials and electric fields. As another example, U.S. Patent Application Publication No. 2015/0137825, which is incorporated herein by reference in its entirety for all purposes, describes reverse sensor and support structure charging effects that provide increased sensitivity for measurements of electric potentials and electric fields. One or more embodiments may enable a camera or eye type electric field imaging system that may be used in harsh weather and/or harsh environments (e.g., harsh marine environments, etc.) to image electrical potentials and electric fields. In some various embodiments, a specialized encasement for electric potential and electric field sensors may be provided that enables the electric potential and electric field sensors to be used in harsh weather and/or harsh environments (e.g., harsh marine environments, etc.). In some various embodiments, a differential electric potential measurement system may include an ephemeral electric field sensor and the differential electric potential measurement system may enable the direct measurement of an electric field. One or more embodiments may provide a method for eliminating intrinsic charging of electric potential and electric field sensors and/or sensor supporting structures. Some various embodiments may enable the use of back projections of surface electric fields to characterize remote sources or regions of interest. Some various embodiments may provide a focusing eye-like electric potential and electric field sensor useful in harsh environments and/or harsh weather.

Figure 1B:
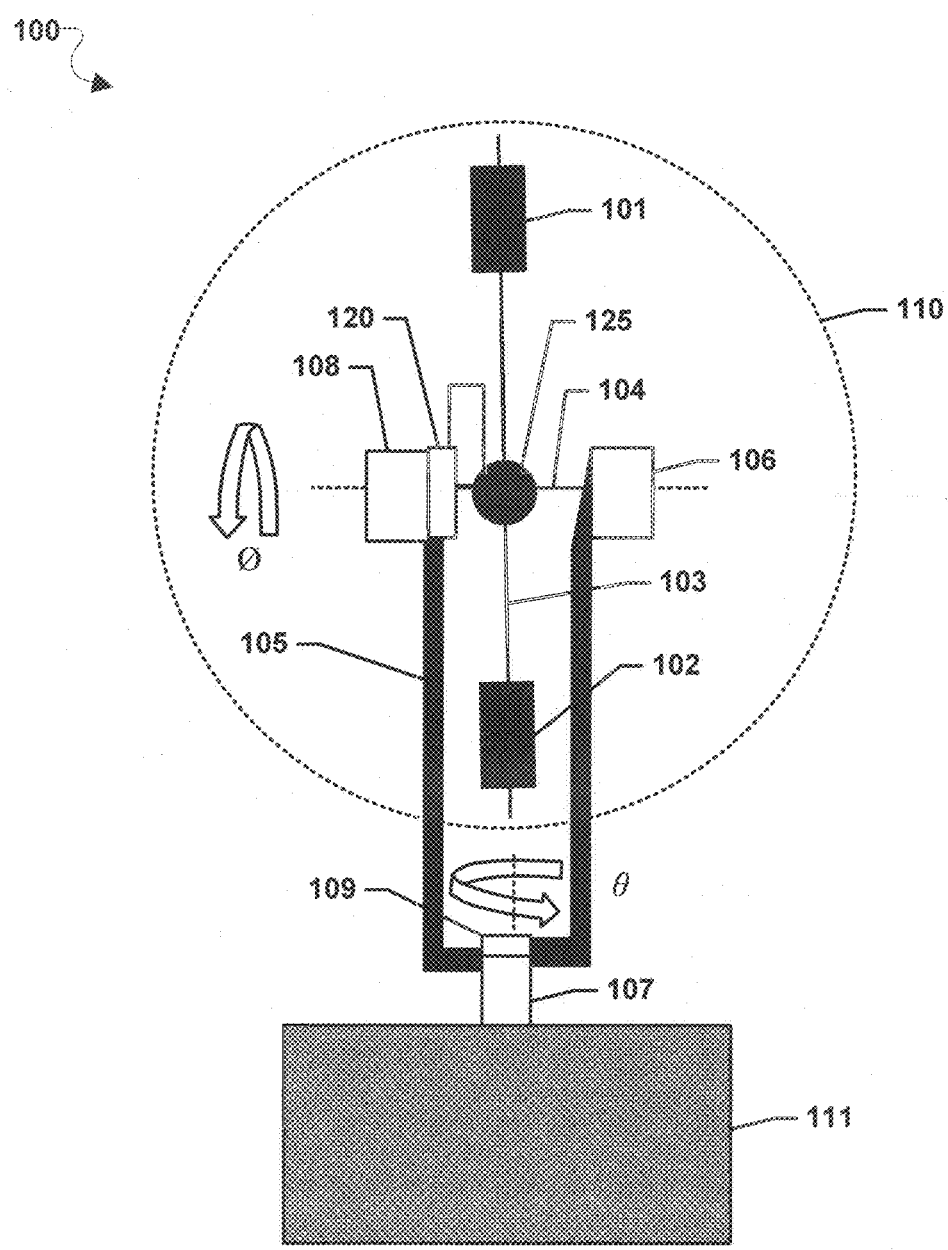

Turning now to the figures, FIGS. 1A and 1B show front and side views, respectively, of an embodiment sensing head 100 of an electric field imaging device, such as an electric field eye sensing system, that may be used to image electrical potentials and electric fields (e.g., harsh marine environments, etc.). The sensing head 100 of the electric field imaging device may be referred to generally as an electric field sensing head. In operation, the sensing head 100 of the electric field imaging device may enable three dimensional electric field imaging based on electric potential measurements obtained from multiple electric field sensors. The sensing head 100 of the electric field imaging device may include two electric potential sensors 101 and 102 disposed at opposite positions, such as opposite ends, of a sensor shaft 103. In different embodiments, the electric potential sensors 101 and 102 may be implemented using various types of electric potential sensors configured to measure voltage and/or voltage differences. For example, in some implementations, the two electric potential sensors 101 and 102 may each be antenna arrays as described in U.S. Pat. No. 9,279,719. As a specific example, in some implementations, the electric potential sensors 101 and 102 may include antenna arrays including a plurality of antennas and transistors (e.g., Junction Field Effect Transistors (JFETs)) coupled to respective antennas in the antenna array such that each transistor gate is only coupled to one of the antennas and a voltage is supplied across a source and a drain of each JFET. In various embodiments, the electric potential sensors 101 and 102 may be matched to have similar electric potential sensor measurement properties. In other embodiments, the electric potential sensors 101 and 102 may not be matched sensors. In some various embodiments, the two electric potential sensors 101 and 102 may be solid state ephemeral electrical potential and electric field sensors.

The sensor shaft 103 may be connected to, and supported by, an axle 104 via a bracket-to-axle-mount 125 that may be triboelectrically neutral, that may have a low electric susceptibility, and/or that may be non-conductive and rotated via a motor 106. The motor 106 may be supported by support bracket 105 about the azimuthal angle Ø, such as less than 360 degrees, 360 degrees, etc. As an example, in a system using macroscopic discrete components, low electric susceptible components may be formed from dry balsa wood and bakelite that has adequately low electric susceptibilities. In contrast, in a system having a dimension of 100 microns, low electric susceptible components may have a very porous form of similar materials with electric constants near 1.0. The axle 104 may be connected to the sensor shaft 103 such that rotation of the axle 104 rotates the sensor shaft 103 and the two electric potential sensors 101 and 102. The motor 106 may rotate the axle 104 and the sensor shaft 103 using, for example, direct connections, gearing, belts, chains, and/or other positioning connection arrangements to the axle 104 and the sensor shaft 103. The support bracket 105 may be rotated via motor 107 about the polar axis θ, such as less than 360 degrees, 360 degrees, etc., using direct connections, gearing, belts, chains, and/or other positioning connection arrangements between the motor 107 and the support bracket 105 to enable the rotation. The polar radius, r, may be the radius of the rotation of the sensor shaft 103 and the electric potential sensors 101 and 102 around the axle 104. The rotations about the azimuthal angle Ø and/or the polar axis θ may be constant or oscillatory. The rotations about the azimuthal angle Ø and/or the polar axis θ may be partial angle rotations. The rotations about the azimuthal angle Ø may be perpendicular to the plane of the rotations of the support bracket 105 about the polar axis θ. While described in reference to FIGS. 1A and 1B as having motors 106 and 107, motors 106 and 107 may be optional. For example, in the vacuum environment of space, the motors 106 and 107 may be replaced by superfluid bearings where the azimuthal and polar rotation may be initiated by an external force and allowed to continue without friction. The motor 107 may be coupled to a stationary base 111. In various embodiments, the shaft 103 may be controllably adjusted to variable lengths to provide additional dynamic focusing for characterizing objects or regions of interest.

The electric potential sensors 101 and 102 and/or the motors 106 and 107 may be powered by any power delivery system, such as solar systems, battery systems, utility power grid systems, etc., that may provide power to the electrical potential sensors 101 and 102 and/or the motors 106 and 107 via wired and/or wireless connections. In embodiments in which conductive wire may be used to connect the electric potential sensors 101 and 102 and/or the motors 106 and 107, noiseless contact slip rings 108 and 109 may be included in the sensing head 100 of the electric field imaging device to carry sensor measurement signals and/or to supply power. Measurement signals may be transmitted by any wired and/or wireless arrangements, such as cable connections, radio frequency connections, infrared connections, etc.

In various embodiments, the sensing head 100 may also optionally include a circumferential contact 120. When present, the circumferential contact 120 may fully reverse the leakage effects on the sensors 101 and 102 and supporting components of the sensing head 100, such as the shaft 103, bracket 105, etc.

In operation, electric potential measurements may be obtained from both electric potential sensors 101 and 102 simultaneously. Electric potential measurements may be provided to an analysis circuit including a processor. The processor may be any processing device, circuit, etc., that may perform operations using the electric potential measurements. The measured paired potentials may be differenced by the processor to provide electric field magnitude along the sensor shaft 103 direction at any point in time. In this manner, a mapping of the electric field may be made over the entire imaginary spherical surface 110 traversed by the electric potential sensors 101 and 102. The mapping of the electric field may be output by the processor of the analysis circuit as electric field and electrical potential images for display on a display connected to the analysis circuit. While two electric potential sensors 101 and 102 are illustrated in FIGS. 1A and 1B, in various embodiments only a single sensor 101 or 102 may be used with differencing performed between measurement locations or a known potential, rather than between two sensor measurements, to determine the electric field.

Figure 2A:
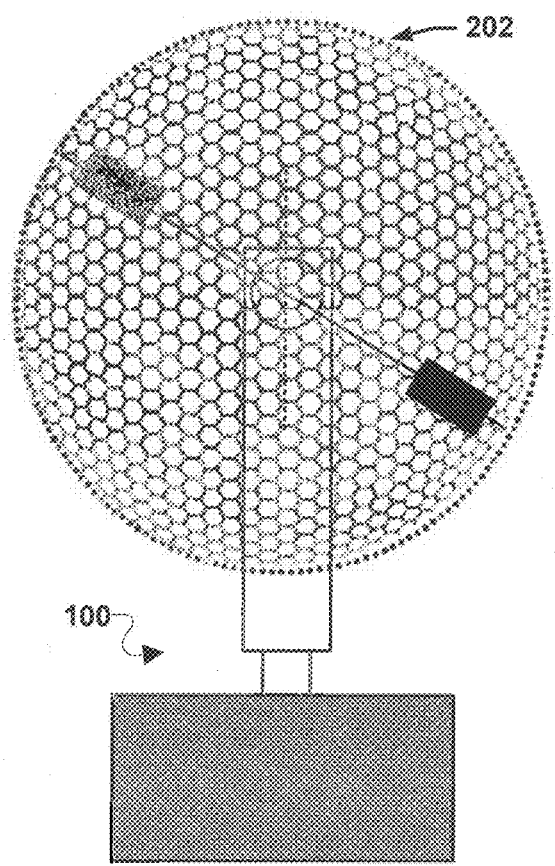
FIGS. 2A and 2B are component block diagrams illustrates side views of embodiment electric field imaging devices including containers enclosing at least a portion of a sensing head, consistent with one or more embodiments of the present disclosure.
Figure 2B:
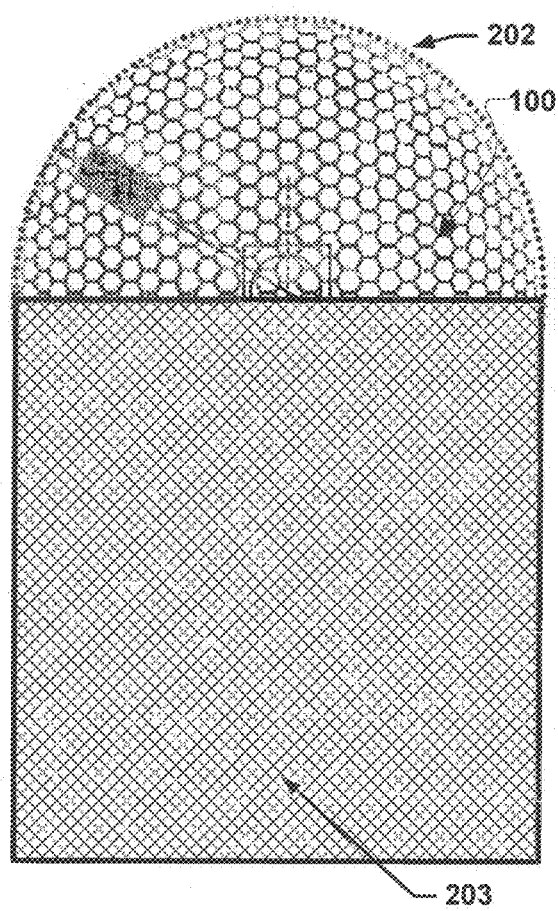

As a freely rotating system, the sensing head 100 of the electric field imaging device may benefit from some protection from foreign objects, the environment, and/or weather, which may damage the sensing head 100 of the electric field imaging device and/or impede its rotation. This protection may be established by mounting the sensing head 100 of the electric field imaging device in an encasement (or container) that meets all the construction requirements for measuring a true original electric field, e.g., a container that may be triboelectrically neutral, that may have a low electric susceptibility, and/or that may be non-conductive. In an embodiment, an electric field imaging device may include a sensing head environmental container 202 arranged over the sensing head 100 such that the container 202 encloses at least a portion of the sensing head 100, for example, as illustrated in FIGS. 2A and 2B. The environmental container 202 may be configured to allow electric potential to vary over its surface while prohibiting the buildup of bound and unbound surface charges, triboelectric charging, and the generation of electrical currents. In some embodiments, the environmental container 202 may be connected to the support bracket 105 or other devices included in the sensing head 100. An example of such an embodiment electric field imaging device is illustrated in FIG. 2A. The rotational, electrical, and/or support elements for the environmental container 202 may be entirely encased in the environmental container 202. In some embodiments, the environmental container 202 may be have additional structure 203, including rotational, electrical, and/or support elements, that are external to the environmental container 202. An example of such an embodiment electric field imaging device is illustrated in FIG. 2B. In addition to providing protection from foreign objects, the environment, and/or weather the environmental container 202 may provide protection from the rotating elements of the sensing head 100 to external devices and/or operators. In various embodiments, the environmental container 202 may be controllably deformable to provide additional dynamic focusing for characterizing objects or regions of interest.

Figure 3:
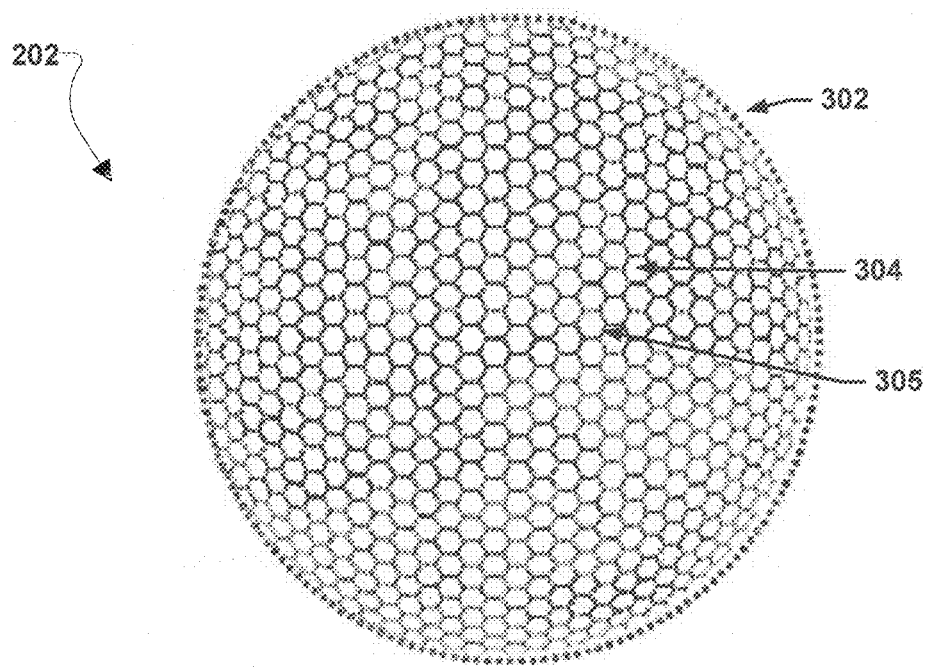
FIG. 3 illustrates a multifaceted spherical surface environmental container of an electric field imaging device, consistent with one or more embodiments of the present disclosure.

As shown in FIG. 3, in one embodiment, the environmental container 202 may include a multifaceted spherical surface 302 including a collection of hexagonal electrically conductive elements (one of which is labeled as hexagonal electrically conductive element 304 in FIG. 3). The hexagonal electrically conductive elements, such as element 304, may have an internal radius of curvature "r1" that is slightly larger than the polar radius "r" of the sensing head 100 and may have an edge length "d". The internal radius "r1" of the hexagonal electrically conductive elements may be polished smooth. The hexagonal electrically conductive elements, such as element 304 may have an external radius "r2" that may be equal to our larger than r1. The external surface of the hexagonal electrically conductive elements, such as element 304, may be polished smooth and may be conditioned or imprinted with a micro-structured surface thereby making the hexagonal electrically conductive elements, such as element 304, super hydrophobic for marine and/or all weather use. The hexagonal electrically conductive elements, such as element 304, may be electrically insulated from each other by a supporting structure 305 that may be triboelectrically neutral, has a low electric susceptibility, and is non-conductive. While illustrated as hexagonal, the embodiments are not so limited. In some embodiments, the conductive elements may be non-hexagonal shapes including, but not limited to as squares, circles, octagons, or any another shape or combination of shapes.

Figure 4:
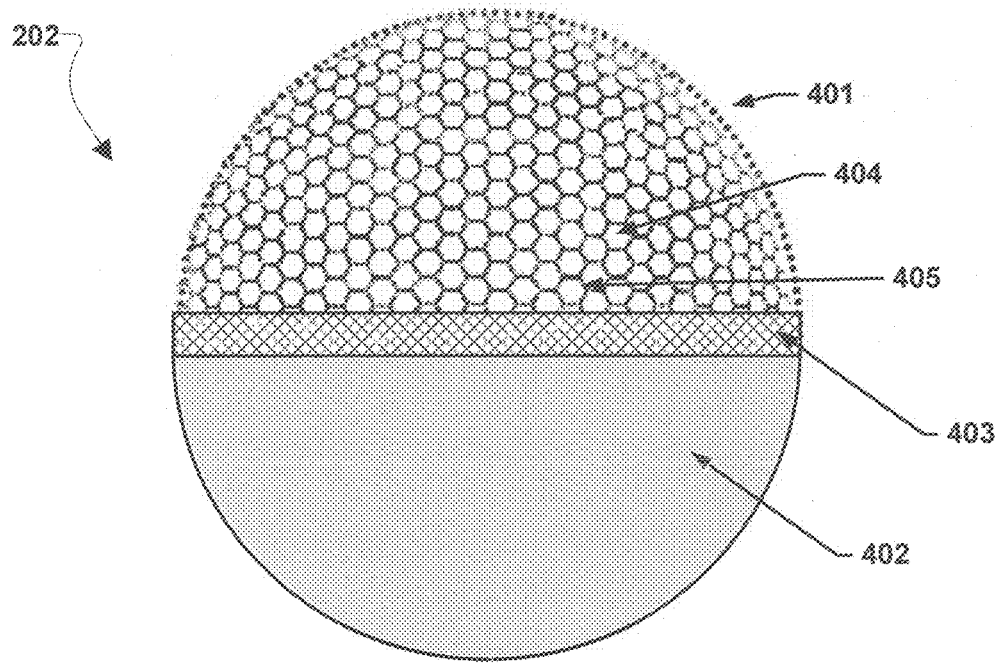
FIG. 4 illustrates a two hemispherical element environmental container of an electric field imaging device, consistent with one or more embodiments of the present disclosure.

FIG. 4 illustrates another embodiment environmental container 202 including two hemispherical elements, a hemispherical element 401 and companion hemispherical element 402. Hemispherical element 401 may include a collection of hexagonal electrically conductive elements (one of which is labeled as hexagonal electrically conductive element 404 in FIG. 4) and supporting structure 405 that are similar to the collection of hexagonal electrically conductive elements and supporting structure 305 described above with reference to FIG. 3. Hemispherical element 402 may be electrically conductive and support a constant potential over its surface. The two hemispheres 401 and 402, when placed together, may be hermetically sealed to be impervious to outside interference or influence. Additionally or alternatively, the two hemispheres 401 and 402 may be electrically insulated from each other by a supporting band structure 403 that may be triboelectrically neutral with a low electric susceptibility and may be non-conductive. The hemisphere 402 may have an internal radius of curvature "r1" that is slightly larger than the polar radius "r" of the sensing head 100. The internal radius "r1" may be polished smooth. The external radius "r2" of the hemisphere 402 may be equal to or larger than "r1". The hemisphere 402 may be non-conductive, triboelectrically neutral, and have a low electric susceptibility. While the environmental container 202 is illustrated as a spherical surface 302 and/or joined hemispheres 401 and 402 in FIGS. 3 and 4, in some embodiments the surface of the environmental container may be formed in shapes other than spheres/hemispheres.

Figure 5:
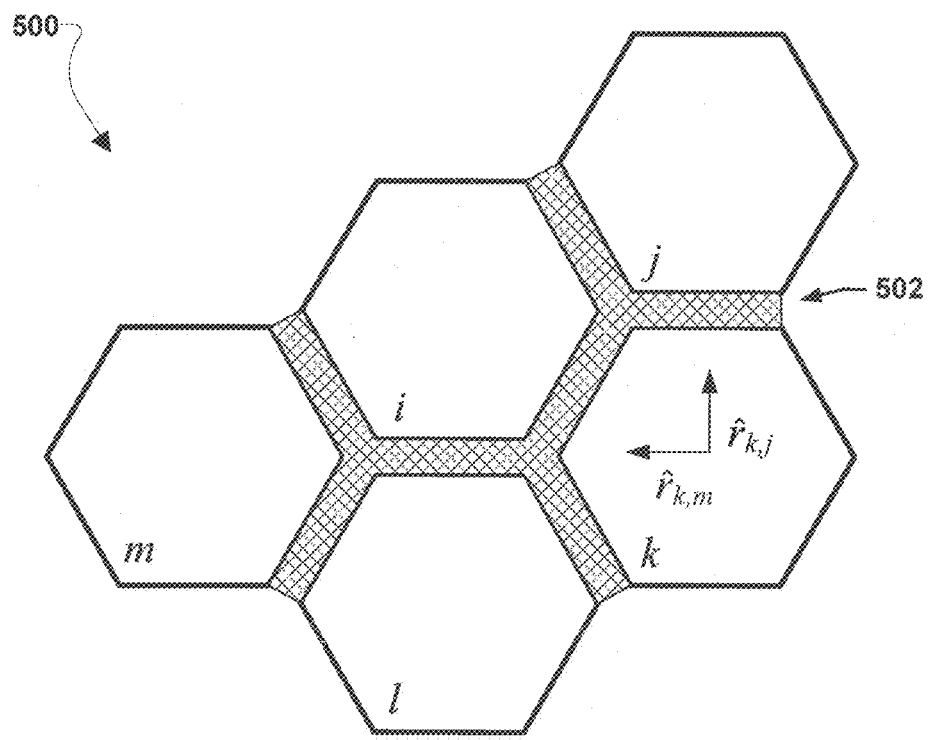
FIG. 5 illustrates a portion of a surface of an environmental container, consistent with one or more embodiments of the present disclosure.

FIG. 5 illustrates a portion 500 of a surface of an environmental container, such as environmental container 202, according to various embodiments including hexagonal electrically conductive elements i, j, k, l, and m and supporting structure 502. The hexagonal electrically conductive elements and supporting structure 502 may be similar to those described above with reference to FIGS. 3 and 4. In the presence of an electric field source or sink P, each on the individual elements i, j, k, l, and m may take on a potential V(θ, Ø) where θ, Ø uniquely identify the conductive elements i, j, k, l, and m located at angles θ, Ø that make up the surface of the environmental container 202. V(θ, Ø) may also be measured when the surface of the environmental container 202 is absent.

In operation, the sensing head 100 measures the electrical potentials V(θ, Ø) and V(θ+180, 180−Ø). The electric field $\vec{E}_r(\theta, \varnothing)$ over the hemispherical surface, such as surface 302 or 401, may be quantitatively obtained by the difference potential between V(θ, Ø) and V(θ+180, 180−Ø) along the sensor shaft 103 of length 2r and unit direction r̂(θ, Ø) such that:

$$\vec{E}_r(\theta_k, \phi_k) = -\left(\frac{V(\theta_k, \phi_k) - V(\theta_k + 180, 180 - \phi_k)}{2r}\right)\hat{r}(\theta_k, \phi_k).$$

The difference potential between tangential orthogonal elements (e.g., elements k, j, and m) $(\theta_k, \varnothing_k)$, $(\theta_j, \varnothing_j)$, and $(\theta_m, \varnothing_m)$ may be used to yield the orthogonal electric field components $\vec{E}_\perp(\theta, \varnothing)$ that are perpendicular to $\vec{r}(\theta, \varnothing)$. For example, $\hat{r}_{k,m}(\theta, \varnothing)$ and $\hat{r}_{k,j}(\theta, \varnothing)$ are orthogonal unit directions at $\vec{r}(\theta, \varnothing)$ such that:

$$\vec{E}_\perp(\theta_k, \phi_k) = -\left(\frac{V(\theta_k, \phi_k) - V(\theta_m, \phi_m)}{|\vec{r}(\theta_k, \phi_k) - \vec{r}(\theta_m, \phi_m)|}\right)\hat{r}_{k,m}(\theta, \phi) -$$
$$\left(\frac{V(\theta_k, \phi_k) - V(\theta_j, \phi_j)}{|\vec{r}(\theta_k, \phi_k) - \vec{r}(\theta_j, \phi_j)|}\right)\hat{r}_{k,j}(\theta, \phi).$$

The radial electric field components $\vec{E}_r(\theta, \varnothing)$ and electric field components tangential to the surface $\vec{E}_\perp(\theta, \varnothing)$ may be combined to determine the electric field over the hemispherical surface, such as surface 302 or 401, according to the equation:

$$\vec{E}_r(\theta_k, \phi_k) = -\left(\frac{V(\theta_k, \phi_k) - V(\theta_k + 180, 180 - \phi_k)}{2r}\right)\hat{r}(\theta_k, \phi_k) -$$
$$\left(\frac{V(\theta_k, \phi_k) - V(\theta_m, \phi_m)}{|\vec{r}(\theta_k, \phi_k) - \vec{r}(\theta_m, \phi_m)|}\right)\hat{r}_{k,m}(\theta, \phi) -$$
$$\left(\frac{V(\theta_k, \phi_k) - V(\theta_j, \phi_j)}{|\vec{r}(\theta_k, \phi_k) - \vec{r}(\theta_j, \phi_j)|}\right)\hat{r}_{k,j}(\theta, \phi).$$

Note that the tangential components are between the orthogonal conductive elements, however these fields may be registered to be located at the selected orthogonal element at θ, Ø in an approximation. A wide variety of approaches may be used to estimate the electric fields given the measured electrical potentials, for example, a Cartesian coordinate system may be used to determine the electric field at the surface according to the equation:

$$\vec{E} = \vec{E}_y + \vec{E}_z + \vec{E}_y$$

Given the known radial and angular locations of the electrically conductive elements, such as elements i, j, k, l, and m, and the polar radius r, and angular positions, θ, Ø, of the sensing head 100, measurement of potential as a function of location and time may be a mapping of the electric potential yielding the electric field at the surface.

Figure 6:
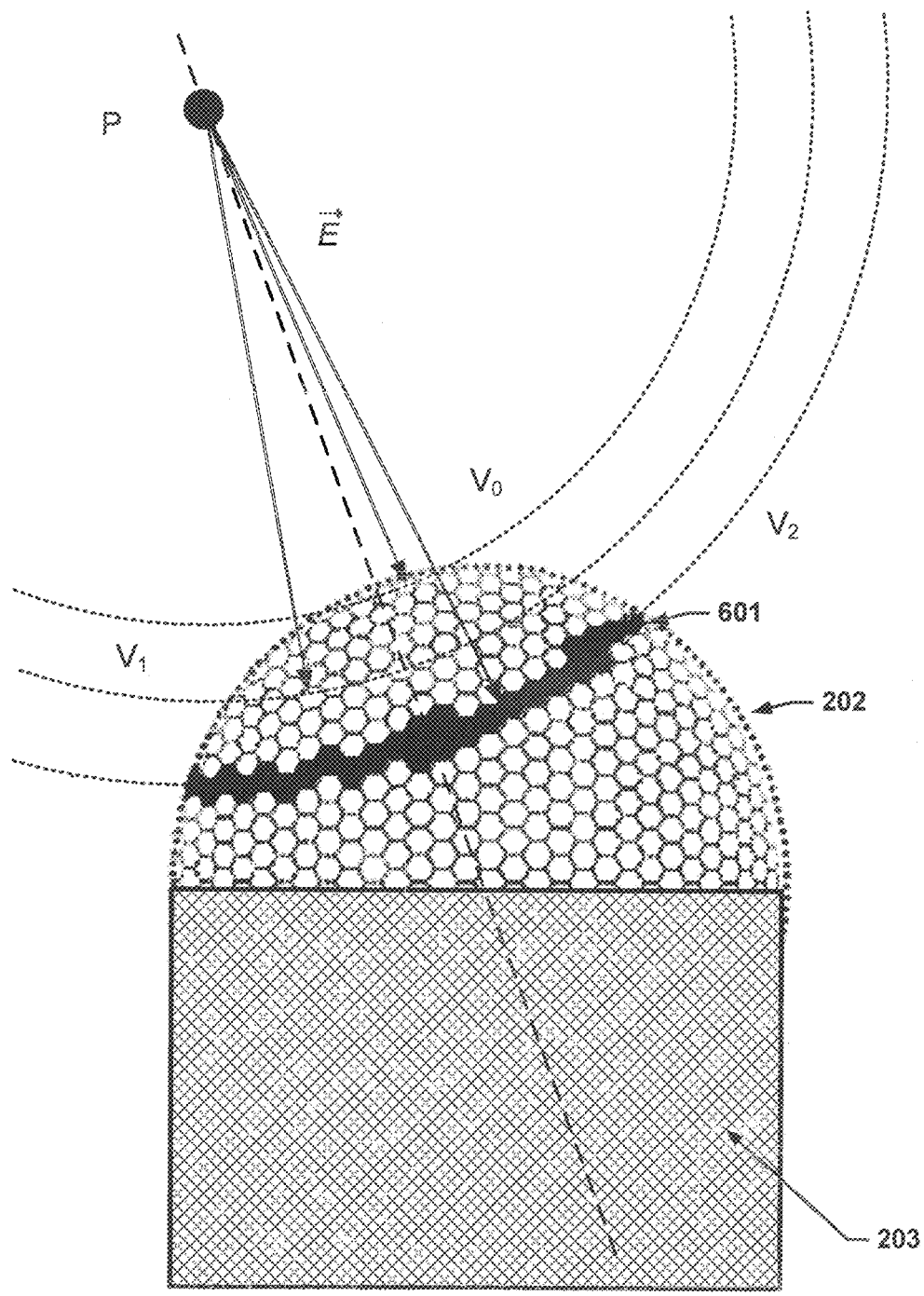
FIG. 6 illustrates example equipotentials of an embodiment electric field imaging device due to a presence of charged source at a remote location, consistent with one or more embodiments of the present disclosure.

FIG. 6 shows conceptually how specific elements lying on the equipotential surfaces of environmental container 202 may be at equipotential $V_0$, $V_1$, and $V_2$ due to the presence of charged source P at a remote location. For example, all the shaded elements 601 of the surface of the environmental container 202 may be at the same electrical potential $V_2$ due to the presence of the source at P. The electrical source or sink location may be specified by identifying the axis of symmetry of the equipotential ring of elements. High spatial resolution of the true equipotential surfaces may be obtained by using alternate element shapes, increasing the density of elements, decreasing the element dimensions, or varying r. Image charges of P may be created when hemisphere 402 is electrically conductive and grounded and these image charges may distort the true original electric field to some extent. When hemisphere 402 is electrically conductive and not grounded it may take on a floating potential given by the electrostatic mean value theorem and also distort the true electric field to some extent. When hemisphere 402 is non-conductive, hemisphere 402 may no longer be at a constant potential and the formation of image charges may not be encouraged.

Figure 7:
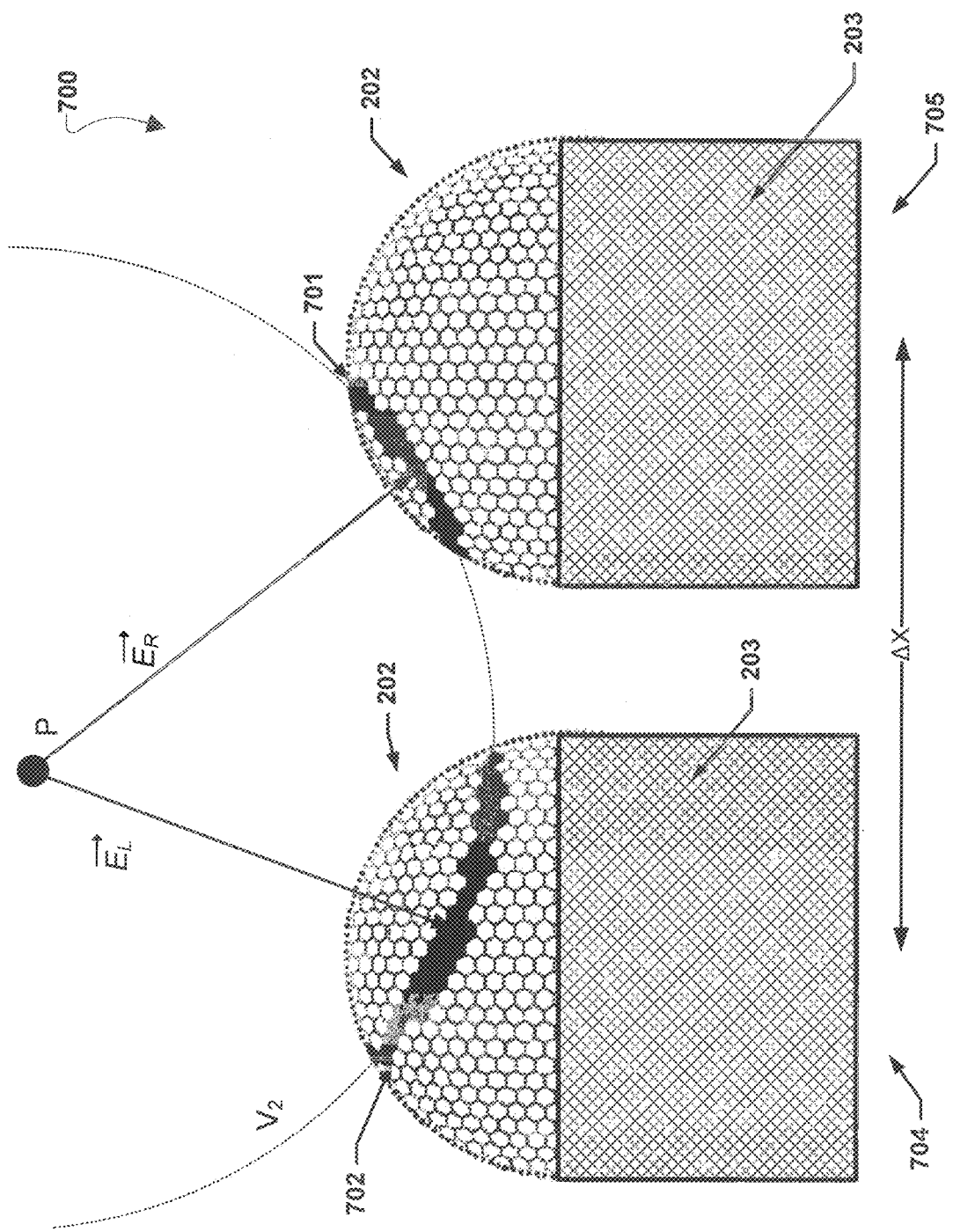
FIG. 7 illustrates an embodiment multiple sensor electric field imaging device.

In various embodiments, an electric field imaging device may use multiple sensing heads, such as two, three, four, or more sensing heads, to enhance characterization of the object or region of interest, determine object or region of interest's location, and/or for 3-dimensional visualization of the object or region of interest with depth perception and measurement by triangulation. FIG. 7 illustrates a two sensor 704 and 705 electric field imaging device 700. The two sensors 704 and 705 may include sensing heads, such as sensing head 100 described above, enclosed in containers 202 and structures 203 as described above, and the center axis of the sensing heads may be separated by a distance ΔX. The shaded elements 701 and 702 may be measured, for example, to be at the same electric potential, V2. Establishing the electric field on the surface of the sensor 704 and the electric field on the sensor 705 may be used, for example, to determine the respective vectors $\vec{E}_R$ and $\vec{E}_L$, thereby uniquely determining the location of the source P of the electric fields. The resolution of the multiple electric field imaging device 700 may be adjusted by adjusting the distance ΔX between the individual sensor sensors 704 and 705. In various embodiments, the number of sensors, such as sensors 704 and 705, may be increased and/or sensors, such as sensors 704 and 705, may be mounted so as to rotate in three dimensions providing additional depth measurement and spatial resolution. The potential measurements from individual electrically conductive elements, such as elements 304 and 404 described above, of a singular sensor, such as sensors 704 and 705, may also be used to provide additional depth measurement and spatial resolution of an object or region of interest. That is to say, that two different conductive elements of the same sensor, e.g., sensor 704, may be used to provide additional depth measurement and spatial resolution of an object or region of interest.

In operational environments, the entire system forming the electric field imaging device may become charged by leakages currents leading to reduced resolution of the electric field sources. For example, this scenario may be created by bathing the system in a uniform electric field for an extended period of time, analogous to the effect of staring at a bright light for a long time. Measurement sensitivity becomes decreased due to the constant application of the electric field creating intrinsic semi-permanent distortions of the true original electric field.

In various embodiments, these distortions may be eliminated by removing the affecting electric field, or by removing the leakage charges that have created the distortion. A solid state device for reversing the effects of leakage charges and current is described in U.S. patent application Ser. No. 15/177,798, which is incorporated herein by reference in its entirety for all purposes. For example, the two electric potential sensors 101 and 102 of the sensing head 100 may be replaced with ergFET based electric potential sensors. This substitution may address localized charging of the sensing elements but may not assist with the charging of the support 203 and/or environmental container 202.

In various embodiments, a more complete reversal of leakage effects may be performed using electromechanical components. For example, two methods for reversal of leakage effects are discussed below. The first method may make use of the circumferential contact 120 to fully reverse the leakage effects on the sensors 101 and 102 and supporting components, such as bracket 105, shaft 103, etc. The second method for reversal of leakage effects may make use of a rotating gate electrode to reverse leakage currents on the sensors 101 and 102, supporting components, such as bracket 105, shaft 103, etc., and the environmental container 202. The first method may be preferred when there is no environmental container 202 used with the electric field imaging device and the second method may be preferred when an environmental container 202 is present.

Figure 8A:
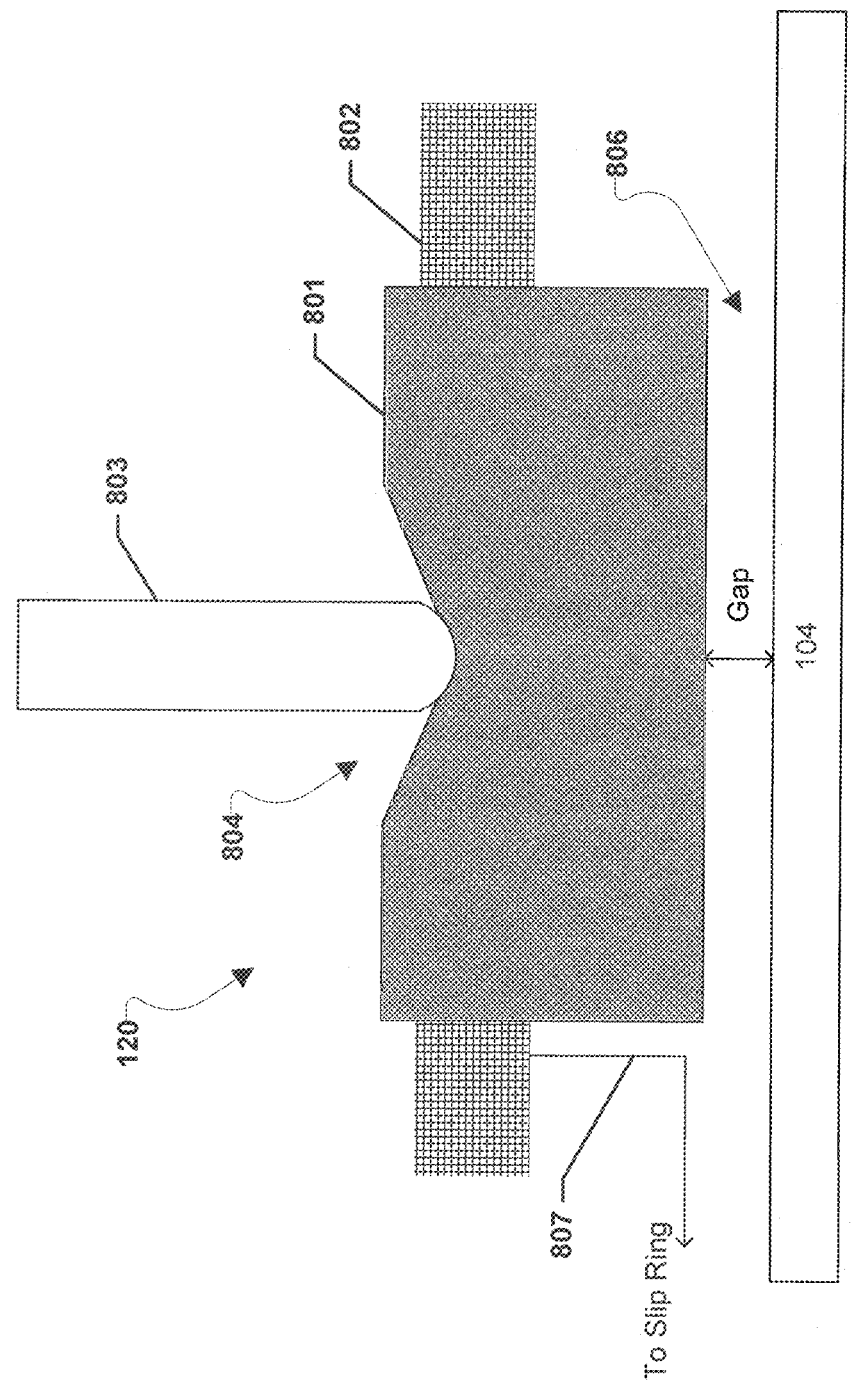
FIG. 8A illustrates a cut-away side view of a circumferential contact suitable for use with one or more embodiments of the present disclosure.
Figure 8B:
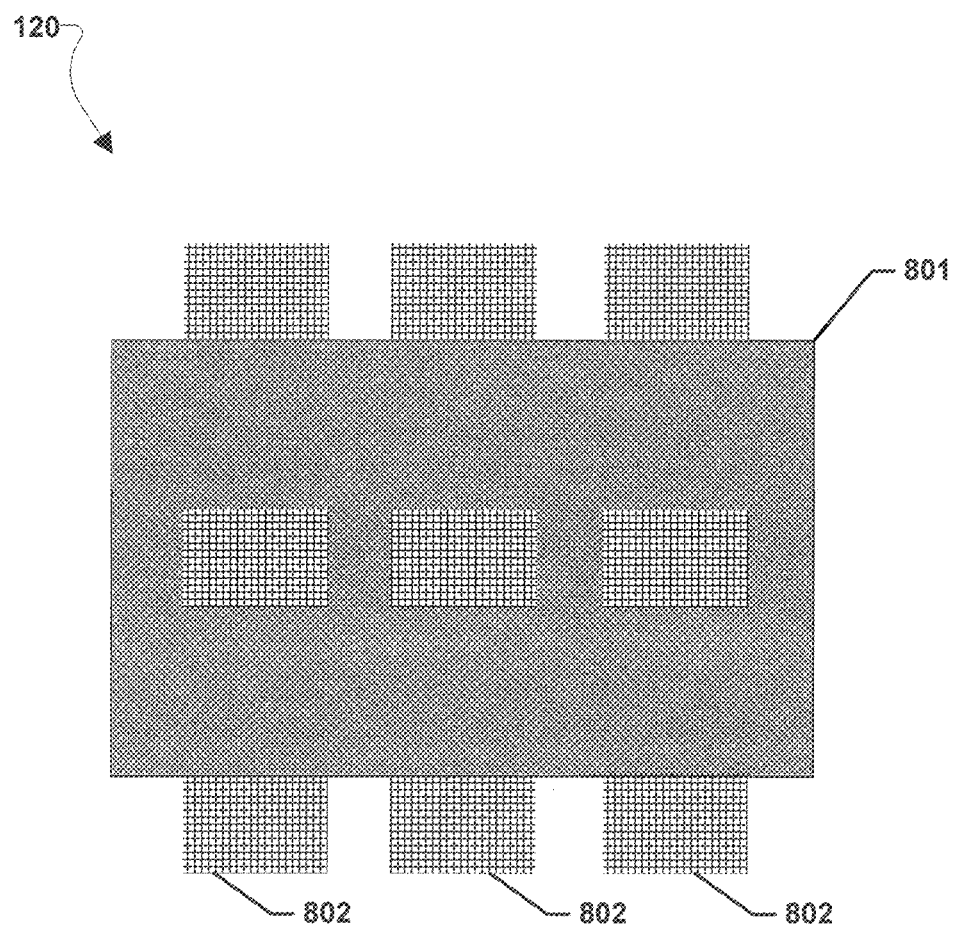
FIG. 8B illustrates an edge view of the circumferential contact of FIG. 8A, consistent with one or more embodiments of the present disclosure.
Figure 8C:
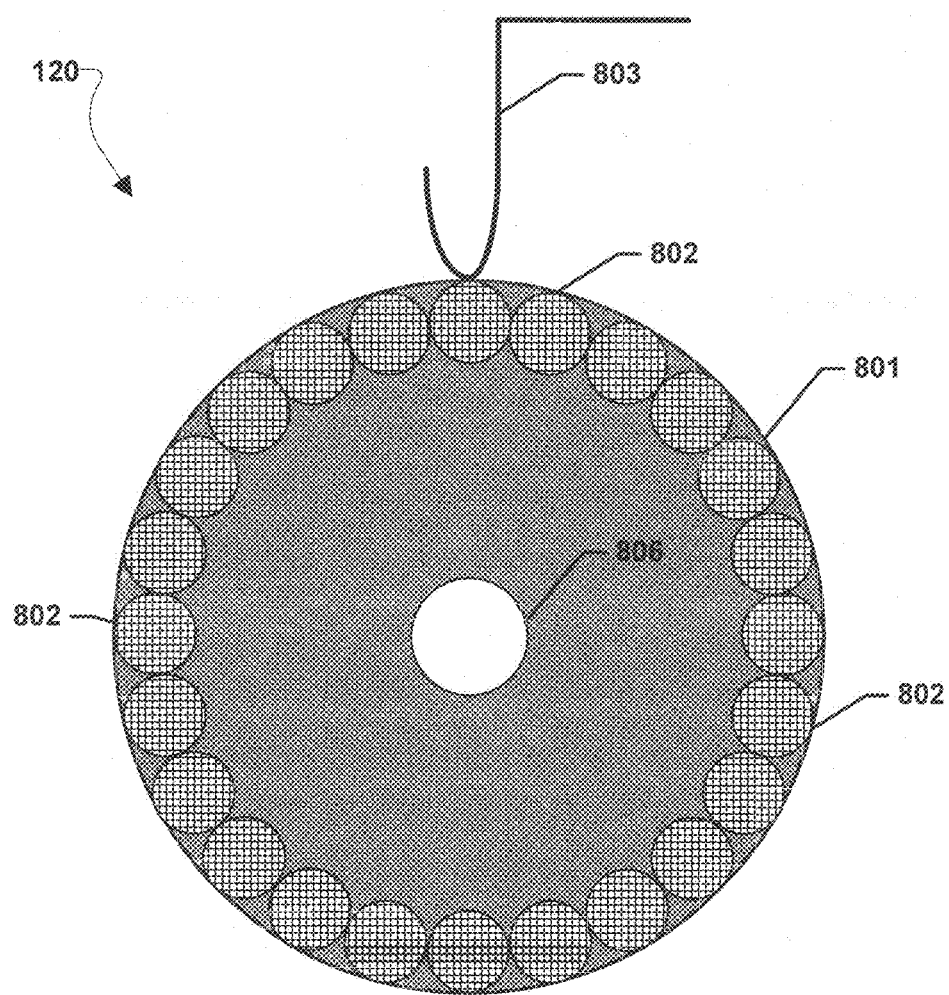
FIG. 8C illustrates a top view of the circumferential contact of FIG. 8A, consistent with one or more embodiments of the present disclosure.
Figure 8D:
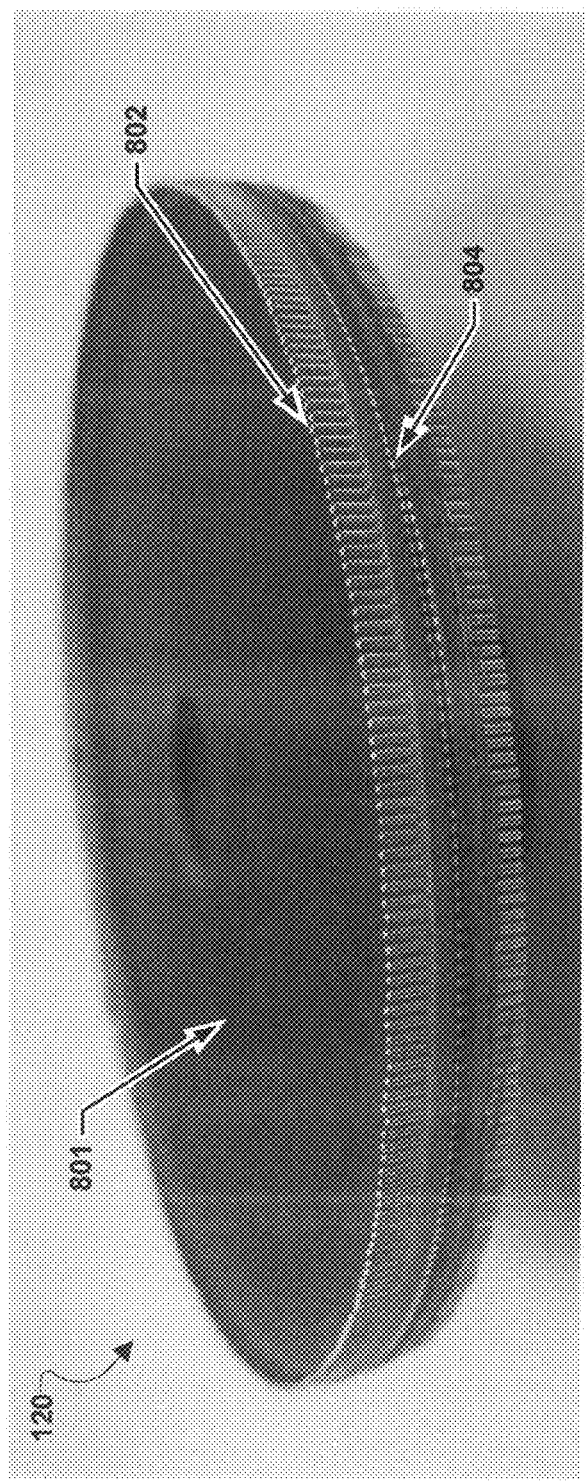
FIG. 8D shows a photograph of a circumferential contact, consistent with one or more embodiments of the present disclosure.

The first method utilizes the circumferential contact 120 as shown, for example, in FIGS. 8A, 8B, 8C, and 8D. FIG. 8A illustrates a cut-away side view of a circumferential contact 120 suitable for use with various embodiments. FIG. 8B illustrates an edge view of the circumferential contact 120 of FIG. 8A. FIG. 8C illustrates a top view of the circumferential contact 120 of FIG. 8A. FIG. 8D shows a photograph of the circumferential contact 120 according to various embodiments. With reference to FIGS. 8A-D, the body 801 of the circumferential contact 120 may be comprised of a material that is triboelectrically neutral, has a low electric susceptibility, and is non-conductive such that the circumferential contact 120 may not support surface charges either bound or unbound. A series of conductive pins 802 may be mounted along the circumference and may be parallel to the circumferential contact axis. Pins 802 may be electrically tied together and may be held a specific electric potential Vsp, for example, ground potential via a small diameter wire 807, such as a small diameter magnet wire, a small diameter wire without insulation, or a small diameter wire with electrical non-conductive insulation, having neutral triboelectric properties and low electric susceptibility. The smallness of the wires may depend on the scale of the measurement system. As an example, for a measurement system using a macroscopic discrete FET having dimensions of 5 mm, small wires may be wires with a 0.1 mm diameter. In contrast, a measurement system having a dimension of 100 of microns may have wire diameters much less than 100 microns. The effect that the select materials or wire diameter has on distorting the original undisturbed electric field may be determined as taught in U.S. patent application Ser. No. 15/177,798. A contact 803 may be supported such that the contact 803 rests centered in a groove 804 along the perimeter of the circumferential contact 120 to provide an intermittent contact with each pin 802 that may be held at a specific electric potential, for example, a ground potential, as the contact 803 rotates around the perimeter of the circumferential contact 120. In some embodiments the potential Vsp on each pin 803 may vary. The circumferential contact 120 may rotate around the axle 104 passed through a center gap 806 in the circumferential contact 120.

Figure 9:
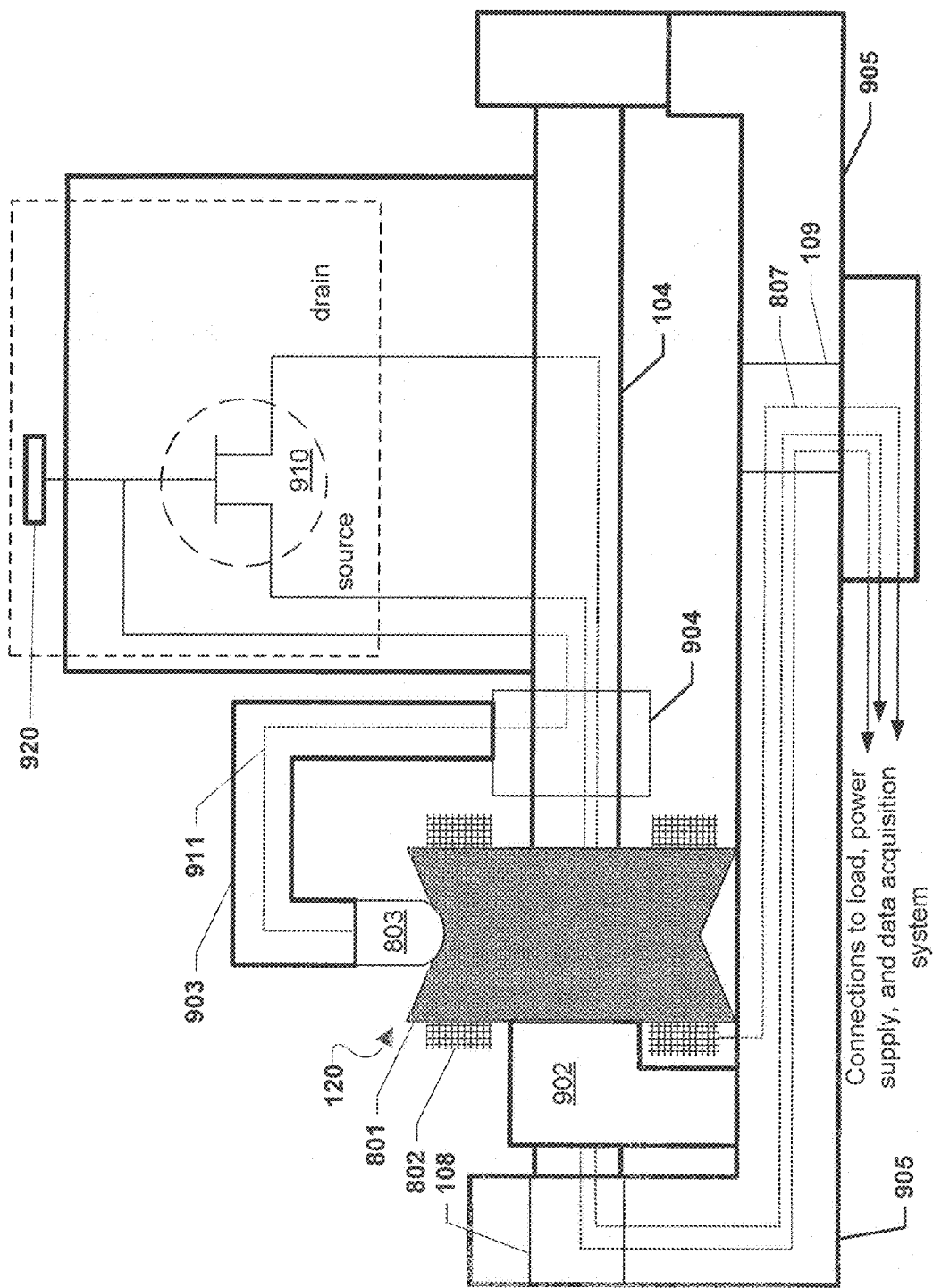
FIG. 9 is a component block diagram illustrating the circumferential contact of FIG. 8A mounted in a sensing head of an electric field imaging device, consistent with one or more embodiments of the present disclosure.

FIG. 9 is a component block diagram illustrating the circumferential contact 120 mounted in the sensing head 100 of an embodiment electric field imaging device. The circumferential contact 120 may be mounted to a sensor support bracket 905 by an adapter 902 that may be triboelectrically neutral, may have a low electric susceptibility, and may be non-conductive. Contact 803 may be supported by the contact support bracket 903 and the contact support bracket 903 may be mounted to axle 104 by the bracket to axle mount 904 so that bracket 903 rotates with axle 104. The contact support bracket 903 and bracket to axle mount 904 may also be formed of a material that is triboelectrically neutral, has a low electric susceptibility, and is non-conductive so that they do not support surface charges either bound or unbound. Wire 807 may be supported by the sensor support bracket 905 and may be held at a specified electrical potential Vsp via a connection through multi-conductor slip ring 109. The contact 803 may be set in a fixed position on the support bracket 903 such that the contact 803 rests centered in the grove 804 along the perimeter of the circumferential contact 120 to provide an intermittent contact with each pin 802 that may be held a specific electric potential, for example, a ground potential, as the contact 803 rotates around the perimeter of the circumferential contact 120. In some embodiments, the potential Vsp on each pin 802 may vary. The gate electrode of a field effect transistor (FET) 910 may be modified to be part of the contact 803 via wire 911. The modified gate of the FET 910 may be intermittently electrically connected to the pins 802 and Vsp 807 via wire 911 as the contact 803 rotates around the perimeter of the circumferential contact 120. During measurements the wire 911 may be a modified floating gate electrode of the FET 910 so that wire 911 may be a small diameter magnet wire or similar so as not to disturb the original electric field to be measured. Measurements may be made when the modified gate electrode of the FET 910 is not electrically connected to the pins 802. It may be preferred that all wiring may be internal to the support structure 905 to provide added electrical insulation. Additionally or alternatively, connections to the source and drain sides of the FET 910 may be provided via direct connection through slip ring contacts in through the sensor shaft 103, axle 104, adapter 902, slip ring 108, support bracket 905, and/or multi-conductor slip ring 109. Connections through the adapter 902, axle 104, support bracket 905, and/or multi-conductor slip ring 109 may connect to loads, power supplies, and/or data acquisition systems.

Figure 10:
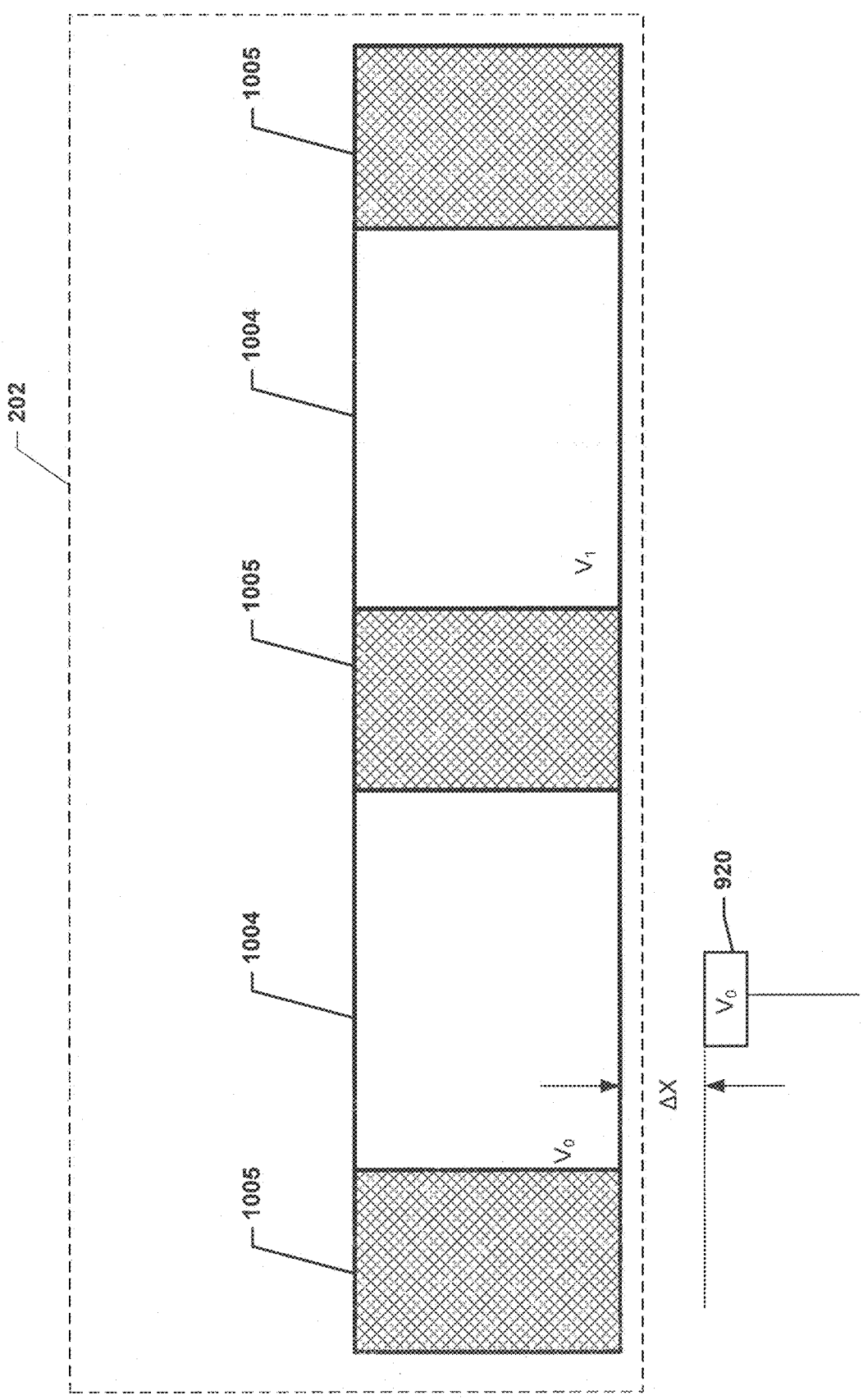
FIG. 10 illustrates an example gate electrode configuration, consistent with one or more embodiments of the present disclosure.

The gate electrode 920 may also be modified in physical shape to provide intrinsic space averaging, via the electrostatic mean value theorem of the measured potential. An example gate electrode shape is as shown in FIG. 10. In an embodiment, the gate electrode 920 may be formed of conductive material. The modified gate electrode 920 may move relative the hexagonal electrically conductive elements 1004, similar to elements 304 or 404 described above, which may be electrically insulated from each other by a supporting structure 1005, similar to support structures 305 and 405 described above. The modified gate electrode 920 may be positioned to be close, ΔX, to the electrically conductive element 1004 in order to measure the potential, e.g., $V_0$, at element 1004. In some configurations, the gate may physically touch element 10004 and, in this manner, the gate and element 1004 become an extended modified gate electrode. When the gate is moved to be near a different element 1004 on the multifaceted surface 202, a measurement of the potential, e.g., $V_1$, may be made at the different element 1004.

Figure 11:
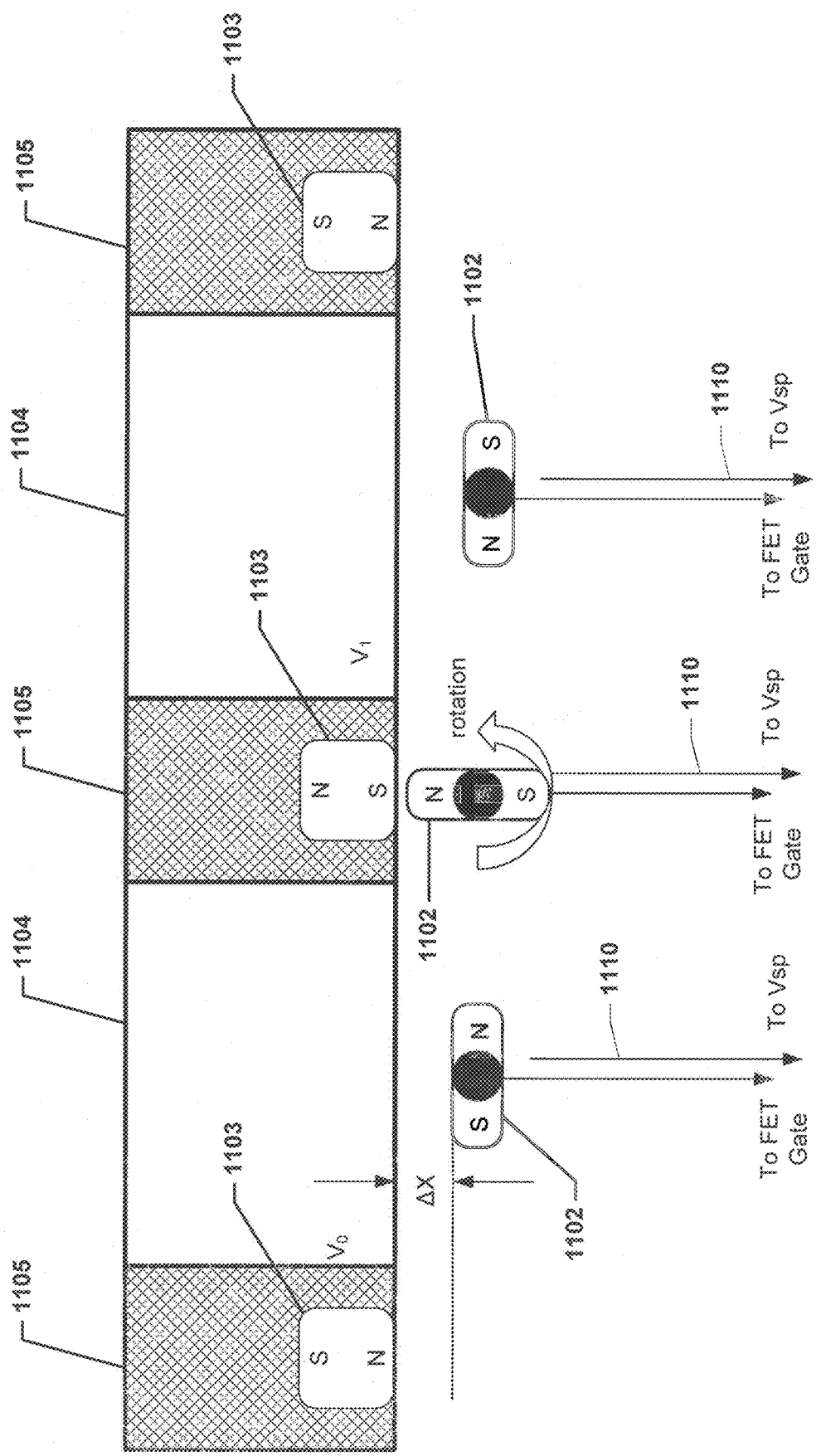
FIG. 11 illustrates a magnetically polarized modified gate electrode, consistent with one or more embodiments of the present disclosure.

The second method may use a modified gate electrode that may be configured to intermittently connect the gate of the FET 910 to specific an electric potential, Vsp, for example, a ground potential, between measurements. The circumferential contact 120 may or may not be used in the second method. A wide variety of methods may be used to create an intermittent connection. FIG. 11 illustrates a method based on magnetically polarized modified gate electrode 1102 and modified support structure 1105 that includes magnetically polarized elements 1103. The polarized elements 103 may be aligned in the modified support structure 1105 such that the magnetic fields are aligned in the opposite direction. Modified support structure 1105 may be similar to support structures 305, 405, and 1005 described above except that it may include the polarized elements 1103. The hexagonal electrically conductive elements 1104 may be similar to elements 304, 404, and 1004 described above. In this configuration, the modified gate 1102 of the FET 910 may rotate about an axis parallel to the axle 104 due to the alignment of the magnetic fields emanating from the modified gate 1102 and from magnetically polarized elements 1103 to intermittently connect to Vsp, via a wire 1110, with potential Vsp before being positioned under an element that may be adjacent. In this manner, the gate of the FET 910 may be intermittently and repetitively electrically connected to the wire 1110 with potential Vsp as the modified gate electrode 1102 is moved along near the inner surface of the multifaceted surface 202. Measurement of the potential, e.g., $V_0$, may be made at the different elements 1104 when gate of the FET 910 is not connected to wire 1110. The magnetic elements 1103 may be electrical non-conductive having neutral triboelectric properties and low electric susceptibility. The magnetic elements 1103 may be of different materials and structures. The potential Vsp on wire 1110 may be placed via direct connection through slip ring contacts in through the sensor shaft 103, axle 104, adapter 902, slip ring 108, support bracket 905, and/or multi-conductor slip ring 109, in a similar manner as described above to connect to the FET 910 and/or the power supply wires.

Figure 12:
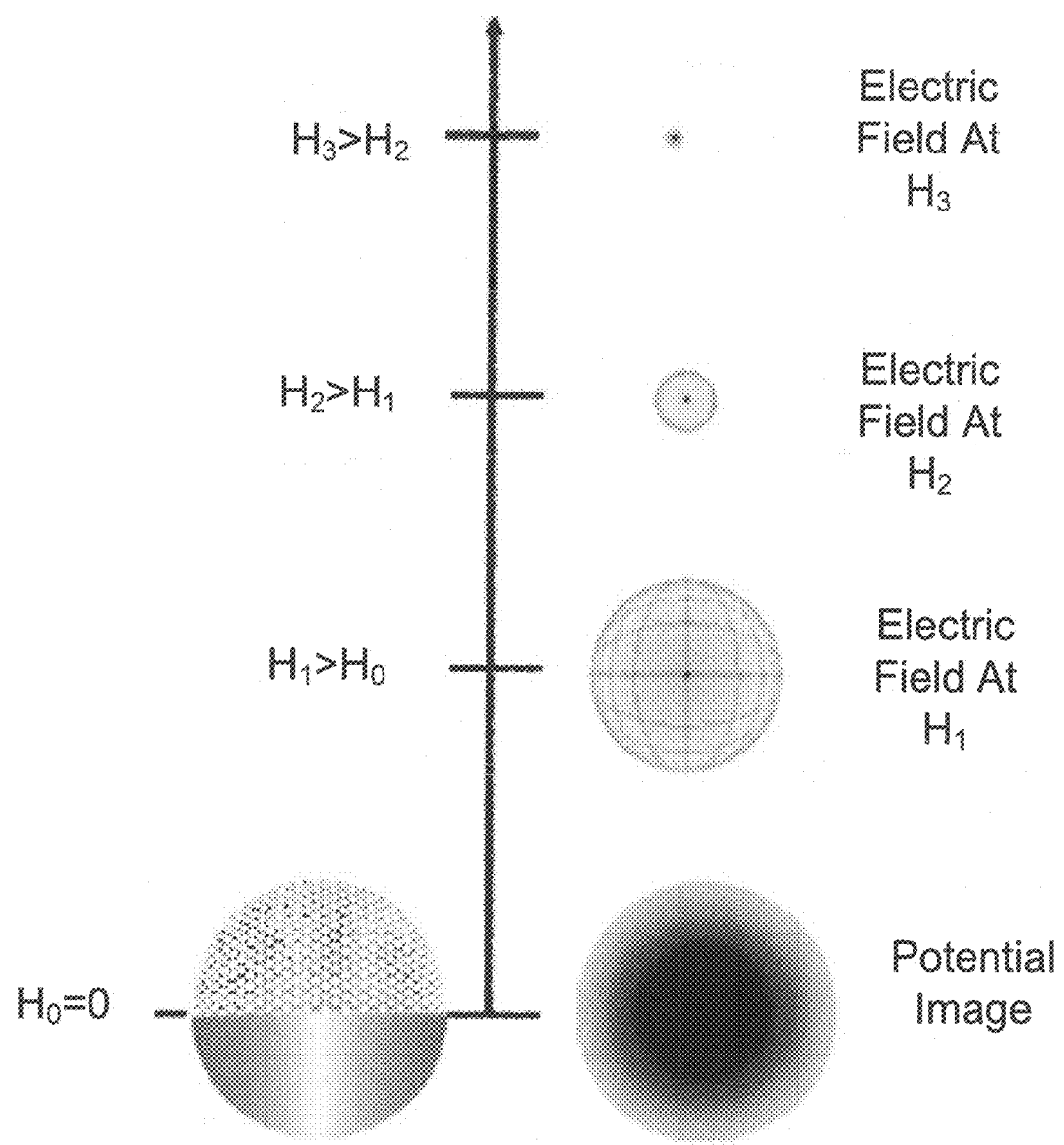
FIG. 12 shows an example a reconstruction simulation of a charged point source at a height, consistent with one or more embodiments of the present disclosure.

Once the electric potential is known at the surface 202, the electric field magnitude and direction may be determined over the surface 202. FIG. 12 shows an example a reconstruction simulation of a charged point source at a height $H_3$. The measured electrical potential along the upper hemispherical surface 202 may be placed at $H_0$ as shown. The electric field may then be determined and may be back projected to determine the source of the electrical potential measured at $H_0$. The back projection of the electric field may be done for various distances H, e.g., $H_1$, $H_2$, $H_3$, etc.

In various embodiments, the utilization of multiple sensor bases systems, such as the system 700 as shown in FIG. 7, allows for direct three dimensional (3D) reconstruction of sources using the same methods described above. The electric potentials at each sensor 704 and 705 may be used to quantify the electric field at the site of the sensors 704 and 705 and back projection of the electric field may be used to characterize the strength and location of remote multiple sources.

Figure 13:
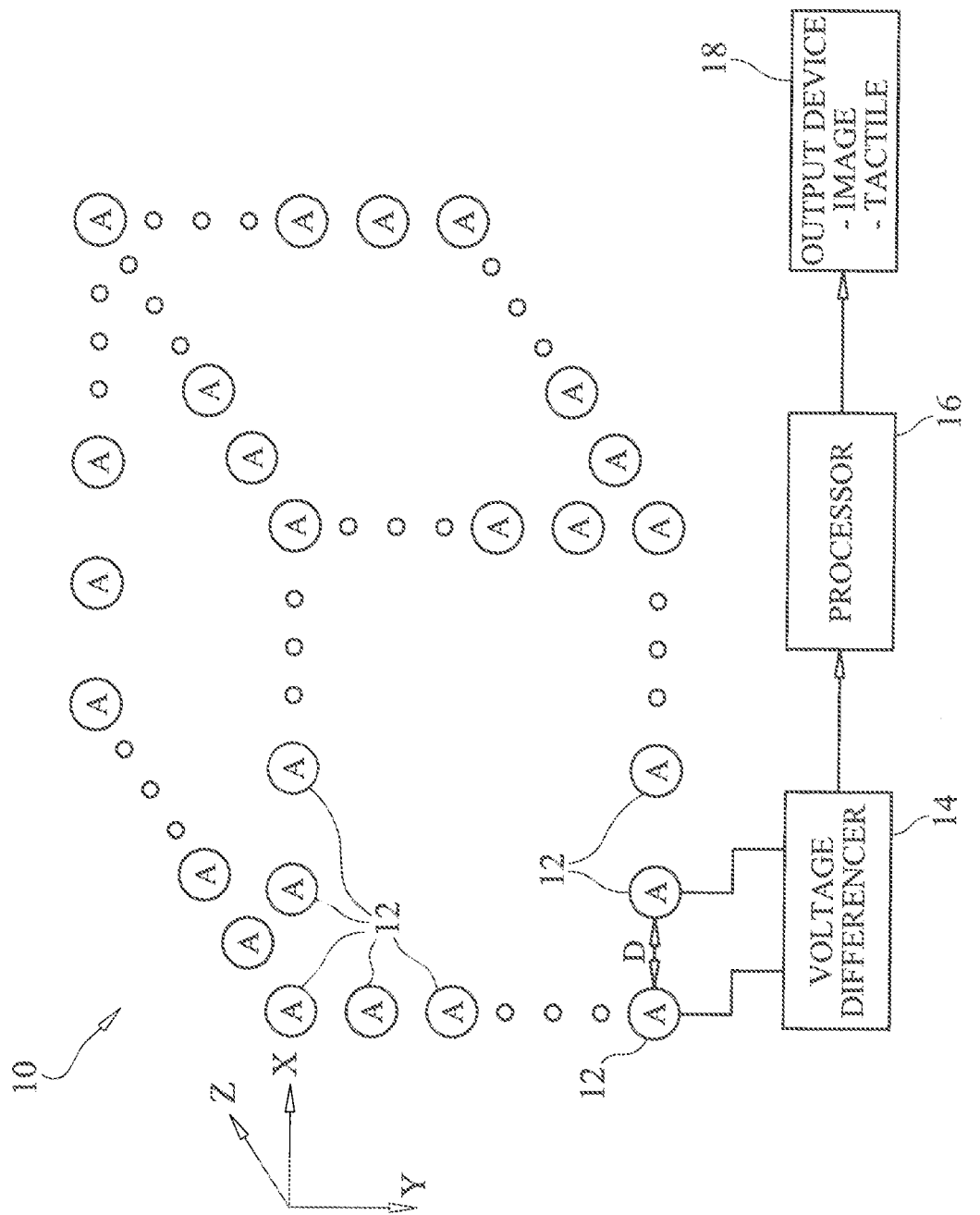
FIG. 13 illustrates a schematic view of a system for making quantitative measurements of an electric field in accordance with an embodiment of the present invention

Referring now to the drawings and more particularly to FIG. 13, a system for making quantitative measurements of an electric field is shown and is referenced generally by numeral 10. As will be explained further below, the quantitative measurements produced by system 10 provide information about both the magnitude and direction of the electric field at a variety of locations therein. System 10 can be configured for large scale or small scale applications to include security applications (e.g., personnel inspection at airports), surveillance applications (e.g., geographic area drive or fly over's), and inspections (e.g., package and/or luggage inspections, wire condition inspections, etc.).

System 10 includes an array of antennas 12 where the array can be comprised of individual physical antennas positioned at each of a plurality of known locations and distances from one another. Array 10 could also be realized in a virtual sense by moving a single antenna to each of the known array locations. However, movement of a single antenna 12 could generate a disturbance in an electric field that is to be measured. Accordingly, such disturbance would need to be accounted for when performing measurement calculations in accordance with the present invention. For sake of simplicity, the remainder of the description will assume that array 10 is formed using a plurality of physical antennas 12 maintained in a known spaced-apart relationship.

In the present invention, array 10 can occupy a three-dimensional space (e.g., in an x, y, z coordinate frame) as illustrated. However, the present invention is not so limited as array 10 could also exist in just two dimensions (e.g., the x-y plane), or even just a single dimension or row of antennas 12 (e.g., a row along the x coordinate). The amount of information about an electric field that is required for a particular application will typically dictate the number of dimensions defined by array 10.

Each of antennas 12 serves as an electric field sensor for its location in array 10. In accordance with the present invention, the voltage difference between one or more selected pairs of antennas 12 is measured or otherwise determined. For simplicity of illustration, a single pair of antennas 12 is coupled to a voltage differencer 14. However, it is to be understood that this capability is typically provided for multiple pairs of antennas 12 in array 10. For example, each selected pair of antennas could encompass two adjacent antennas.

Voltage differencer 14 is any device, circuit, etc., that can collect voltages sensed by a selected pair of antennas 12 and then form a difference (i.e., a voltage difference) between the voltages so-collected. Each such collected voltage difference is provided to a processor 16.

Processor 16 is any processing device, circuit, etc., that processes each voltage difference by dividing it by the distance D between the antennas of the pair. The resulting quantity is a "voltage per distance" quantity for the particular antenna pair. Since the locations of antennas 12 are known, the "voltage per distance" between the two known locations is a vector quantity. This process is repeated for each selected pair of antennas 12 in array 10. The resulting set of "voltage per distance" quantities over the known antenna array locations describes the electric field in the region occupied by array 10. Depending on the application, this information can be further processed by processor 16, or could be provided to some type of output device 18 for data "presentation" to a user. For example, output device 18 could be capable of producing a viewable image of the electric field data. In other applications, output device 18 could be capable of producing a tactile output felt by a user so that changes in an electric field would be readily recognized and located. Output device 18 could also provide other and/or multiple types of outputs without departing from the scope of the present invention.

Various embodiments may enable electric field microscopy suitable for use in developing micro-systems, nano-systems, and self-organizing and alignment systems. Various embodiments may be used in harsh environments (e.g., harsh marine environments, etc.) to remotely detect, inspect, and/or characterize personnel, baggage, wire insulation, hidden objects, subterranean variations, material properties, materials, material damage, material age, material integrity, and/or structural variations. Various embodiments may provide a range of inspection and/or characterization capabilities, including inspection and/or characterization in harsh environments (e.g., harsh marine environments, etc.) of liquid, solid, emulsion, foam, insulating, semi-conductive, conductive, metallic, non-metallic, polymer, ceramic, composite, etc. materials and complex structures and their substructures. The various embodiments may also be applied to product quality control and intruder detection in harsh environments (e.g., harsh marine environments, etc.). Various embodiments may enable remote measurement and location identification of human muscle electrical potential (including measurement and imaging of cardiac polarization wave, remote EKG, assistance in diagnosis of muscle related diseases), measurement and imaging of intra-cranial electrical potentials, and measurement and imaging of triboelectric properties of materials and systems.

It will be readily understood that the components of various embodiments of the present disclosure, as generally described and illustrated in the figures herein, may be arranged and designed in a wide variety of different configurations. Thus, the detailed description of the embodiments of the present disclosure, as represented in the attached figures, is not intended to limit the scope of the invention as claimed, but is merely representative of selected embodiments of the invention.

The features, structures, or characteristics of the present disclosure may be combined in any suitable manner in one or more embodiments. For example, reference throughout this specification to "certain embodiments," "some embodiments," or similar language means that a particular feature, structure, or characteristic described in connection with the embodiment is included in at least one embodiment. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages should be or are present in any single embodiment of the invention. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment. Furthermore, features, advantages, and characteristics described herein may be combined in any suitable manner in one or more embodiments. For example, although aspects and features may in some cases be described in individual figures, it will be appreciated that features from one figure can be combined with features of another figure even though the combination is not explicitly shown or explicitly described as a combination. Moreover, one skilled in the relevant art will recognize that the invention can be practiced without one or more of the specific features or advantages of a particular embodiment illustrated in the figures or described herein. In other instances, additional features and advantages may be recognized in certain embodiments that may not be present in all embodiments of the invention. One having ordinary skill in the art will readily understand that the invention as discussed above may be practiced with steps in a different order, and/or with hardware elements in configurations which are different than those which are disclosed.

Other aspects and embodiments may will be apparent from consideration of the specification. It is intended that the specification and illustrated embodiments be considered as examples only with a true scope of the invention being indicated by the following-claims.

What is claimed is:

1. An apparatus comprising:
   a first sensing head comprising:
      one or more electric potential sensors, the one or more electric potential sensors including a first electric potential sensor;
      a sensor shaft; wherein the first electric potential sensor is disposed on the sensor shaft; and
      an axle connected to the sensor shaft such that rotation of the axle rotates the sensor shaft and the first electric potential sensor about the axle; and
   an analysis circuit connected to the first sensing head and configured to receive electric potential measurements from the first electric potential sensor and map an electric field based at least in part on the received electric potential measurements from the first electric potential sensor;
   wherein the one or more electric potential sensors includes a second electric potential sensor;
   wherein the second electric potential sensor and the first electric potential sensor are disposed on opposite ends of the sensor shaft;
   wherein rotation of the axle rotates the sensor shaft, the first electrical potential, and the second electric potential sensor about the axle;
   wherein the analysis circuit is further configured to receive electric potential measurements from the second electric potential sensor and map the electric field based at least in part on the received electric potential measurements from the first electric potential sensor and the received electric potential measurements from the second electric potential sensor
   wherein in rotating the sensor shaft the axle rotates about a first axis; and
   wherein the first sensor head further comprises a support bracket connected to the axle and configured to rotate the axle about a second axis that is perpendicular to the first axis.

2. The apparatus of claim 1, wherein a length of the sensor shaft is adjustable.

3. The apparatus of claim 1, wherein the first electrical potential sensor and the second electric potential sensor are both solid state ephemeral electric potential and electric field sensors.

4. The apparatus of claim 3, wherein the first electrical potential sensor and the second electric potential sensor are matched sensors.

5. The apparatus of claim 3, wherein the first electrical potential sensor and the second electric potential sensor are unmatched sensors.

6. The apparatus of claim 3, wherein the first electrical potential sensor and the second electric potential sensor are both equilibrium reversing gate field effect transistor based electric potential sensors.

7. The apparatus of claim 1, further comprising a container enclosing at least a portion of the first sensing head; and wherein the container is non-conductive, triboelectrically neutral, and has a low electric susceptibility.

8. The apparatus of claim 1, further comprising a container enclosing at least a portion of the first sensing head; and wherein the container is controllably deformable.

9. The apparatus of claim 1, further comprising:
a second sensing head comprising:
a third electric potential sensor;
a second sensor shaft; wherein the third electric potential sensor is disposed on the second sensor shaft; and
a second axle connected to the second sensor shaft such that rotation of the second axle rotates the second sensor shaft and the third electric potential sensor about the second axle,
wherein the analysis circuitry is connected to the second sensing head and configured to receive electric potential measurements from the third electric potential sensor and map the electric field based at least in part on the received electric potential measurements from the first electric potential sensor, the received electric potential measurements from the second electric potential sensor, and the received electric potential measurements from the third electric potential sensor.

10. The apparatus of claim 1, wherein the first electric potential sensor and the second electric potential sensor each comprises:
an antenna array; and
a Field Effect Transistor (FET) connected to each of a plurality of antennas in the antenna array, wherein each FET's gate is only connected to one of the antennas and a voltage is supplied across a source and a drain of each FET.

11. The apparatus of claim 1, wherein the first sensing head further comprises a circumferential contact electrically connected to the first electric potential sensor, wherein the circumferential contact is triboelectrically neutral, has a low electric susceptibility, and is non-conductive, the circumferential contact configured to reverse leakage effects of the first electric potential sensor.

12. An apparatus, comprising:
a first sensing head comprising:
one or more electric potential sensors, the one or more electric potential sensors including a first electric potential sensor;
a sensor shaft; wherein the first electric potential sensor is disposed on the sensor shaft; and
an axle connected to the sensor shaft such that rotation of the axle rotates the sensor shaft and the first electric potential sensor about the axle; and
an analysis circuit connected to the first sensing head and configured to receive electric potential measurements from the first electric potential sensor and map an electric field based at least in part on the received electric potential measurements from the first electric potential sensor;
a container enclosing at least a portion of the first sensing head; and
wherein the container comprises a multifaceted surface including a collection of electrically conductive elements.

13. The apparatus of claim 12, wherein the electrically conductive elements are hexagonal electrically conductive elements.

14. The apparatus of claim 12, wherein the container is configured to be hydrophobic.

15. The apparatus of claim 14, wherein the electrically conductive elements are insulated from one other by a supporting structure that is triboelectrically neutral, has a low electric susceptibility, and is non-conductive.

16. The apparatus of claim 15, wherein:
the first electric potential sensor and the second electric potential sensor comprise rotating gate electrodes; and
the supporting structure includes polarized elements aligned such that magnetic fields of successive polarized elements are aligned in opposite directions.

17. The apparatus of claim 16, further comprising:
a field effect transistor connected to the first electric potential sensor; and
a contact including a plurality of conductive pins and a contact point connected to the field effect transistor, wherein conductive points are configured and arranged to intermittently contact the contact point while the axle is rotated and thereby provide a fixed electric potential intermittently to the field effect transistor connected to the first electric potential sensor.

* * * * *